Jan. 13, 1970 A. J. WOLTERMAN 3,489,919
COMPARATOR CIRCUIT WITH HIGH INPUT VOLTAGE ISOLATION
Filed March 29, 1966
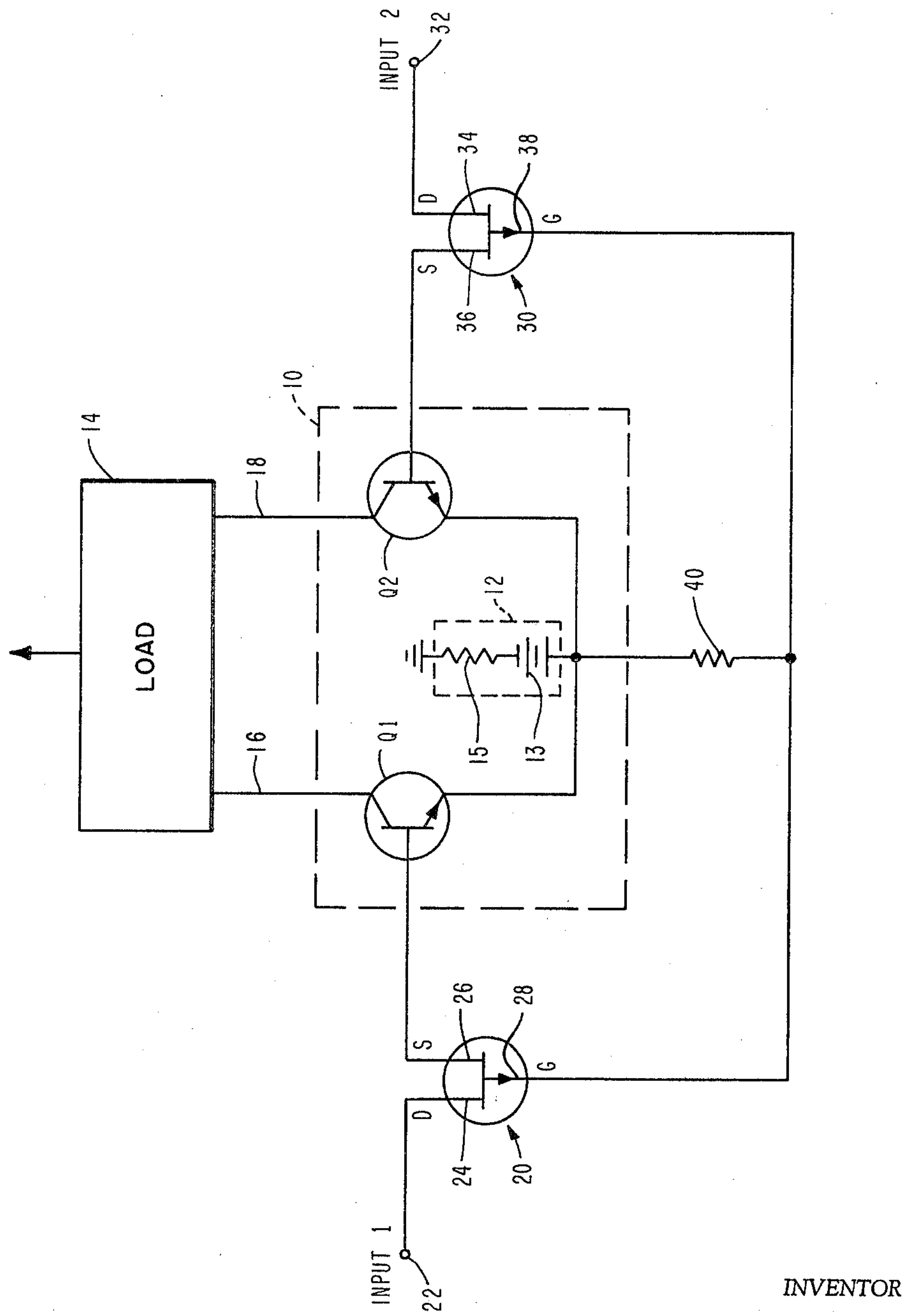
INVENTOR
ARDEN J. WOLTERMAN
BY Thomas & Thomas
ATTORNEYS United States Patent Office 3,489,919

Patented Jan. 13, 1970

3,489,919
COMPARATOR CIRCUIT WITH HIGH INPUT VOLTAGE ISOLATION

Arden J. Wolterman, Apalachin, N.Y., assignor to International Business Machines Corporation, Armonk, N.Y., a corporation of New York Filed Mar. 29, 1966, Ser. No. 538,277
Int. Cl. H02h 7/20
U.S. Cl. 307—202 7 Claims

ABSTRACT OF THE DISCLOSURE

A protective circuit for a comparator in the form of a differential amplifier is provided using a field effect transistors in series each of the two input lines. The pinch off voltage of each field effect transistors is made less than any deleterious reverse bias level in the comparator caused by the differential input signals, thereby resulting in removal of such input signals from the comparator by rendering one of the field effect transistors non-conductive.

BACKGROUND OF THE INVENTION (1) This invention relates to a comparator circuit for comparing two input signals and more particularly to such a circuit which is provided with protective devices to isolate excessive input signals.

(2) When two input signals are applied to a comparator, the comparator circuitry may be subjected to excessive signal levels because of the relatively vast difference in magnitude of the two input signals. The differential between the two input signals may be applied as a back voltage to some of the components in the comparator. If the magnitude of the back voltage is sufficiently high, it may have various deleterious effects on circuit components or the accuracy of the comparator. For example, where unilateral conducting devices are employed in comparators, a sufficiently high back voltage may cause reverse breakdown of the unilateral conducting devices resulting in damage to such unilateral conducting devices or impairment of the accuracy of the comparator circuit or both. It is desirable, therefore, to minimize back currents and preserve comparator accuracy as well as prevent damage to the circuit components of the comparator.

SUMMARY OF THE INVENTION

It is a feature of this invention to provide an improved comparator circuit which includes protective devices to isolate excessive signal level differentials developed between two input signals.

It is a feature of this invention to provide an improved comparator which utilizes solid state components, and protective devices are employed to isolate selected circuit components from excessive back signal levels.

It is a feature of this invention to provide an improved comparator circuit which utilizes transistors as circuit components, and field effect transistors are provided to isolate back voltage signal levels, thereby to protect the comparator circuit against excessive back signal levels.

In one arrangement according to this invention first and second transistors are disposed in a comparator circuit where high back signal levels may develop, and first and second field effect transistors are connected between first and second input signals and the respective first and second transistors. The gates of the field effect transistors are connected together, and the common point is biased by being connected through an impedance to the common emitter point of the comparator transistors. The pinch off voltage of the field effect transistors is made less than the magnitude of the reverse bias signal level required to cause reverse breakdown of the first or second transistors. Whenever the signal differential between the two inputs exceeds a certain predetermined level which is less than the reverse breakdown level, one of the field effect transistors is rendered non-conductive, thereby removing the associated input signal and isolating its associated transistor from the deleterious effect of an excessive back signal level.

The foregoing and other objects, features and advantages of the invention will be apparent from the following more particular description of a preferred embodiment of the invention, as illustrated in the accompanying single drawing.

DESCRIPTION OF THE PREFERRED EMBODIMENT

Referring to the drawing, a comparator 10 includes transistors Q1 and Q2 with their emitters connected in common to a source of current 12 which may be a battery 13 and a resistor 15. The collectors of the transistors Q1 and Q2 are coupled to a load 14 by respective lines 16 and 18 as illustrated. The comparator 10 may be considered a differential amplifier, and the load 14 may be considered a second differential amplifier.

A field effect transistor 20 is disposed between an input terminal 22 and the base electrode of the transistor Q1. The field effect transistor 20 has a drain electrode 24, a source electrode 26, and a gate electrode 28. A field effect transistor 30 is disposed between an input terminal 32 and the base of the transistor Q2. The field effect transistor 30 has a drain electrode 34, a source electrode 36, and a gate electrode 38. The gates of the field effect transistors 20 and 30 are biased by being connected in common to one end of a resistor 40 the opposite end of which is connected to the common emitters of the transistors Q1 and Q2. It is permissible to substitute a diode for the resistor 40.

Input signals to be compared are applied to input terminals 22 and 32, designated respectively as input 1 and input 2. The signal levels to be compared may be of opposite polarity, such as positive or negative signals, or the input signals may be of the same polarity but different in magnitude. The input signals may be analog or digital signals. If digital signals are employed, for example, both input signals may be positive when each represents a binary one and both input signals may be negative when each represents a binary zero. Alternatively, both input signals may have a negative polarity of a given magnitude when each represents a binary one, and both input signals may have negative polarity of a still greater magnitude when each represents a binary zero. In essence then the relative potential level, not an absolute value, may be employed to represent arbitrary analog or digitary values. Table I below uses the designations of high and low to represent relative input values, and there are four possible combinations shown for the two input signals.

TABLE I

| Case | Input I | Input II | Result |
|---|---|---|---|
| 1 | High | Low | Unlike. |
| 2 | Low | High | Unlike. |
| 3 | Low | Low | Alike. |
| 4 | High | High | Alike. |

Let it be assumed for purposes of illustration that the transistors Q1 and Q2 are NPN transistors, and the field effect transistors 20 and 30 are P channel devices. The input signal levels are of different magnitudes which are arbitrarily designated high and low, and the high level is the more positive level.

If it is assumed first for purposes of illustration that the level of the input 1 signal is high and input 2 is low, this is case 1, Table I. Under the assumed conditions the field effect transistors 20 and 30 conduct and the transistors Q1 and Q2 become respectively conductive and nonconductive. That is, the more negative signal level at input 2 turns the transistor Q2 off, and the more positive signal level at input 1 turns the transistor Q1 on. The base-emitter circuit of the transistor Q2 is reverse biased by a signal level which is substantially equal to the difference of the two input signals. If the input differential is large enough, the base-emitter junction of the transistor Q2 will break down. However, the pinch off voltage of the field effect transistor 30 is less than the reverse base-emitter breakdown level of the transistor Q2. When the pinch off level is reached, the field effect transistor 30 becomes non-conductive, and this isolates the base of the transistor Q2 from the input 2 before the reverse breakdown level of the transistor Q2 is reached. In essence the two input signals are isolated from each other by the field effect transistor 30.

Next, let it be assumed that the conditions for case 2 in Table I are established. In this case the more positive signal level is applied to input 2, and the less positive signal level is applied to input 1. The field effect transistors 20 and 30 conduct, thereby applying the signal levels of input 1 and input 2 to the base electrodes of respective transistors Q1 and Q2. The transistor Q2 is rendered conductive, and the transistor Q1 is rendered non-conductive. Consequently, the base-emitter circuit of the transistor Q1 is reverse biased. If the input differential were large enough, the base emitter of the transistor Q1 would break down. However, the pinch off voltage of the field effect transistor 20 is less than the reverse base-emitter breakdown level of the transistor Q1, and thus the field effect transistor 20 is rendered non-conductive before the reverse breakdown level of the base-emitter circuit of the transmitter Q1 is reached. Thus the input 1 is isolated from the base of the transistor Q1. In essence the two inputs are isolated from each other by the field effect transistor 20.

Let it be assumed next that the conditions for case 3 in Table I are established. In this instance the input signal levels for input 1 and input 2 are both low. The field effect transistors 20 and 30 conduct, and the transistors Q1 and Q2 are both rendered conductive as there is no problem of a back voltage in this case because both input levels have substantially the same magnitude.

If the conditions for case 4 in Table I are established, the signal levels for input 1 and input 2 are both high. In this case the field effect transistors 20 and 30 are rendered conductive. The transistors Q1 and Q2 are both rendered conductive because both input signal levels have the same magnitude, and no problem of back bias exists.

The currents supplied from the transistors Q1 and Q2 of the comparator 10 may be interpreted by the load 14 to indicate whether input 1 and input 2 are unlike, and if so, which one is larger.

Thus it is seen that a unique and novel circuit arrangement is provided whereby the field effect transistors 20 and 30 protect the transistors Q1 and Q2 of the comparator 10 from excessive back signal levels for cases 1 and 2 of Table I. Furthermore, the field effect transistors 20 and 30 do not affect the accuracy of the comparator 10 for cases 1 through 4 of Table I because they present a low resistance path to the input signals except when performing the isolation function, and this allows a comparison accuracy which is dependent only on the two transistors Q1 and Q2.

While the invention has been particularly shown and described with reference to a preferred embodiment thereof, it will be understood by those skilled in the art that various changes in form and details may be made therein without departing from the spirit and scope of the invention.

What is claimed is:

1. A comparator circuit and a protective circuit in combination;

the comparator circuit including first and second transistors;

first and second input sources;

the protective circuit including first and second field effect transistors;

means connecting the first field effect transistor between the first input source and the first transistor of the comparator circuit;

means connecting the second field effect transistor between the second input source and the second transistor of the comparator circuit; and a control circuit connected between the first and second transistors of the comparator circuit and the first and second field effect transistors of the protective circuit to bias one of the field effect transistors to the non-conductive state whenever an excessive signal differential exists between the first and second input sources.

2. The apparatus of claim 1 wherein the control circuit includes an impedance, one end of which is connected to the first and second field effect transistors and the opposite end of which is connected to the first and second transistors.

3. A comparator circuit and a protective circuit in combination:

the comparator circuit including first and second transistors;

first and second input signals;

the protective circuit including first and second field effect transistors;

first means connecting the first field effect transistor between the first input signal and the first transistor of the comparator circuit;

second means connecting the second field effect transistor between the second input signal and the second transistor of the comparator circuit;

third means connected between the first and second transistors of the comparator and the first and second field effect transistors of the protective circuit for biasing both of the field effect transistors normally in the conductive state, whereby said first and second input signals are supplied respectively to said first and second transistors;

said third means including an impedance one end of which is connected to the first and second field effect transistors of the protective circuit and the opposite end of which is connected to the first and second transistors of the comparator, said third impedance providing a variable control signal to said first and second field effect transistors for driving one of said field effect transistors to the non-conductive state whenever a large signal difference exists between the first and second input signals, thereby to protect the first and second transistors from a deleterious back bias established by said first and second input signals.

4. The apparatus of claim 3 wherein:

said first and second field effect transistors each having a drain electrode, a source electrode, and a gate electrode;

means connecting the drain electrode of said first field effect transistor to said first input signal, means connecting the source electrode of said first field effect transistor to said first transistor, and means connecting the gate electrode of said first field effect transistor to said one end of said impedance; and means connecting the drain electrode of said second field effect transistor to said second input signal, means connecting the source electrode of said second field effect transistor to said second transistor, and means connecting the gate electrode of said second field effect transistor to said one end of said impedance.

5. A circuit device including:

first and second transistors each including a base electrode, an emitter electrode, and a collector electrode;

a first input source and a second input source;

first and second field effect transistors each including a drain electrode, a source electrode and a gate electrode, said field effect transistors having a pinch off voltage which is less than the reverse breakdown voltage of the base-emitter circuit of said first and second transistors;

means connecting the first input source to the drain electrode of the first field effect transistor, and means connecting the source electrode of the first field effect transistor to the base electrode of said first transistor;

means connecting the second input source to the drain electrode of the second field effect transistor, and means connecting the source electrode of the second field effect transistor to the base electrode of said second transistor;

means connecting the emitter electrodes of said first and second transistors to a current source;

an impedance device having one end connected to both emitter electrodes of said first and second transistors and the other end of which is connected to both of the gate electrodes of said first and second field effect transistors; and means connecting the collector electrodes of said first and second transistors to a load device;

whereby the first and second field effect transistors isolate the first and second input sources from the base electrodes of said first and second transistors whenever a predetermined back bias is established across the base-emitter electrodes of said first and second transistors.

6. The apparatus of claim 5 wherein said first and second transistors are of the NPN type and the first and second field effect transistors are P channel devices.

7. The apparatus of claim 5 wherein said first and second transistors are of the PNP type and the first and second field effect transistors are N channel devices.

References Cited

UNITED STATES PATENTS

| | | | |
|---|---|---|---|
| 3,260,947 | 7/1966 | Dorsman | 330—30 |
| 3,399,357 | 8/1968 | Weilerstein | 330—30 |
| 2,846,522 | 1958 | Brown | 330—9 |
| 3,046,487 | 1962 | Matzen | 330—69 |
| 3,140,408 | 1964 | May | 330—9 |
| 3,370,242 | 2/1968 | Offner | 330—69 |
| 3,370,245 | 2/1968 | Royce | 330—69 |
| 3,375,457 | 3/1968 | Hollstein. | |

DONALD D. FORRER, Primary Examiner

H. A. DIXON, Assistant Examiner

U.S. Cl. X.R.

307—235, 251